United States Patent
Li et al.

(10) Patent No.: US 6,461,954 B1
(45) Date of Patent: Oct. 8, 2002

(54) METHOD AND AN APPARATUS FOR FORMING AN UNDER BUMP METALLIZATION STRUCTURE

(75) Inventors: Jian Li, Sunnyvale; Xiao-Chun Mu, Saratoga, both of CA (US); Sridhar Balakrishnan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/929,408

(22) Filed: Aug. 14, 2001

Related U.S. Application Data

(62) Division of application No. 09/389,162, filed on Sep. 2, 1999, now Pat. No. 6,312,830.

(51) Int. Cl.[7] .............................................. H01L 21/30
(52) U.S. Cl. ........................ 438/613; 438/612; 438/648; 438/660; 228/180.22
(58) Field of Search .................................. 438/612, 613, 438/614, 660, 648; 228/180.22

(56) References Cited

U.S. PATENT DOCUMENTS

| | | |
|---|---|---|
| 5,466,635 A | 11/1995 | Lynch et al. |
| 5,492,235 A | 2/1996 | Crafts et al. |
| 5,656,858 A | 8/1997 | Kondo et al. |
| 5,719,070 A | 2/1998 | Cook et al. |
| 5,736,456 A | 4/1998 | Akram |
| 5,773,359 A | 6/1998 | Mitchell et al. |
| 5,789,318 A | 8/1998 | Delfino et al. |
| 5,943,597 A | 8/1999 | Kleffner et al. |

FOREIGN PATENT DOCUMENTS

| | | |
|---|---|---|
| DE | 197 45 575 A1 | 4/1998 |
| JP | 07226403 A | 8/1995 |
| JP | 03707345 A | 11/1995 |
| WO | WO99/13501 | 3/1999 |

OTHER PUBLICATIONS

XP 000672432–The Stability of $TiH_2$ Used as Diffusion Barrier on $SiO_1$ Substrates, Shyam P. Murarka, Mat. Res. Soc. Symp. Proc. vol. 337, 1994 Materials Research Society.

Primary Examiner—Deborah Jones
Assistant Examiner—Stephen Stein
(74) Attorney, Agent, or Firm—Blakely, Sokoloff, Taylor & Zafman LLP

(57) ABSTRACT

Methods and apparatuses are disclosed in which a refractory layer is formed during rapid thermal processing wherein ambient hydrogen is used in the thermal processing chamber. Rapid thermal processing may occur at a temperature approximately in the range of 350° C. to approximately 550° C.

9 Claims, 4 Drawing Sheets

METHOD AND AN APPARATUS FOR FORMING AN UNDER BUMP METALLIZATION STRUCTURE

This application is a divisional application of Jian Li, Xiao-Chun Mu, and Sridhar Balakrishnan entitled "A Method and Apparatus for Forming an Underbump Metallization Structure", Ser. No. 09/389,162, filed Sep. 2, 1999, now U.S. Pat. No. 6,312,830, and incorporated herein by reference.

FIELD OF THE INVENTION

The invention relates generally to electronic assembly technology and more specifically to forming a refractory hydride films or layers under bump metallization structures.

BACKGROUND

One method of coupling bonding-pads of an integrated circuit chip to a package is by forming a metal bump (e.g., tin-lead (Sn—Pb) solder bump) on each pad and soldering the substrate to a package. IBM calls its version of this technology controlled collapse chip connection (C4).

Improvements in the area of bump metallization include incorporating an under bump metallization (UBM) layer onto a chip. An UBM layer acts as a barrier preventing elements from diffusing between pad on a substrate and the bump that connects a bump chip and its packaging substrate. Additionally, an UBM layer improves adhesion between the bump and the pad on a substrate. Moreover, an UBM layer may act as a wetting layer that ensures improved chip joint properties between a solder-based bump and the pad on the substrate. These advantages apply to an UBM layer comprising a two layer structure A/B—C, wherein A is, for example, a non-refractory metal such as gold or nickel and B—C is a binary metal alloy such as titanium/tungsten (Ti/W), or a three layer structure A/B/C wherein A is a nonrefractory metal and B and C are refractory metals.

Refractory metals and their nitrides, such as titanium (Ti) and titanium nitride (TiN) are widely used as adhesion promoter and diffusion barrier layers in UBM. A refractory metal nitride layer such as TiN can be formed by depositing TiN via physical sputtering or chemical vapor deposition or annealing refractory metal in an $N_2$ or $NH_3$ ambient at temperatures up to 700° C. However, high temperature back-end processing can lead to serious reliability related failure, especially in a chip using copper-based interconnects.

Several other disadvantages exist with processes known in the art. One problem is that interdiffusion of elements occurs between a bump and a pad when a packaged chip operates at a higher temperature. This causes the UBM layer to react with tin (Sn) contained in solder to form intermetallic compounds that are mechanically and electrically harmful to chip joints. The interfacial reaction at the bump/UBM interface can lead to delamination of the UBM layer on a pad, inducing chip malfunction. Moreover, electromigration (EM) induced failure may result at the bump/UBM interface from using known methods due to "voids" forming near the interface of the solder bump materials such as tin-lead (Sn—Pb) and UBM materials when a high current is imposed on a bump at 100° C. It is therefore desirable to simplify the process of forming UBM layers and generally improve the effectiveness of the UBM layer.

SUMMARY

In one embodiment, a method is disclosed including forming a refractory layer over a pad coupled to a substrate and annealing the refractory layer in ambient hydrogen.

BRIEF DESCRIPTION OF THE DRAWINGS

The invention is illustrated by way of example. The invention is not limited to the figures of the accompanying drawings in which like references indicate similar elements. Additionally, the elements are not drawn to scale.

DETAILED DESCRIPTION

Methods are disclosed for forming a UBM structure that includes a refractory hydride layer. In the following description, numerous specific details such as layer thicknesses, sequences, times, temperatures, etc., are set forth in order to provide a more thorough understanding of the present invention. It will be apparent, however, to one skilled in the art, that the present invention may be practiced without employing these specific details. In other instances, well known processes and processing techniques have not been described in detail in order to avoid unnecessarily obscuring the present invention.

One embodiment of the invention describes a UBM material comprised of refractory metals selected from the group comprising hafnium (Hf), niobium (Nb), titanium (Ti), vanadium (V), zirconium (Zr), or any combination thereof deposited onto a pad that is formed over a substrate. In one embodiment, the UBM may have a thickness that ranges from approximately 1000 Å to 5000 Å. These metals may be combined with a variety of other components to ensure physical and chemical stability such as copper (Cu) and nickel (Ni) to form a copper-nickel-titanium (Cu/Ni/Ti) layered structure.

Figure 1A:
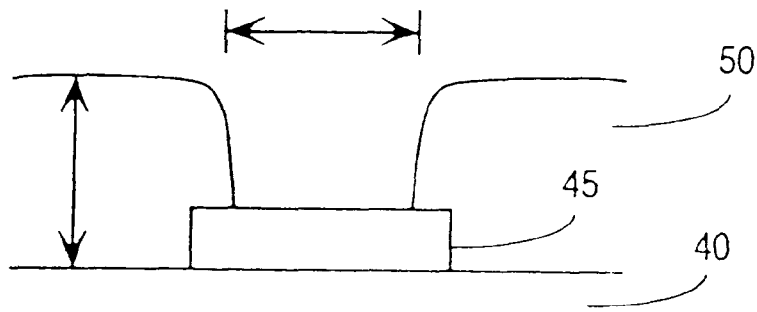
FIG. 1A shows a cross-sectional side view of a pad and a passivation layer on a substrate.
Figure 1B:
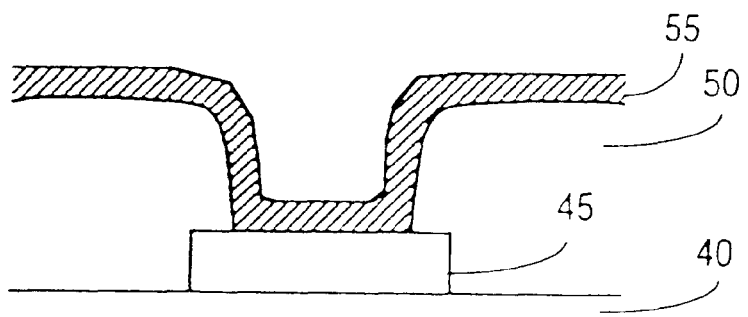
FIG. 1B shows a cross-sectional side view of the device shown in FIG. 1A with an under bump metallization layer deposited onto the pad.
Figure 1C:
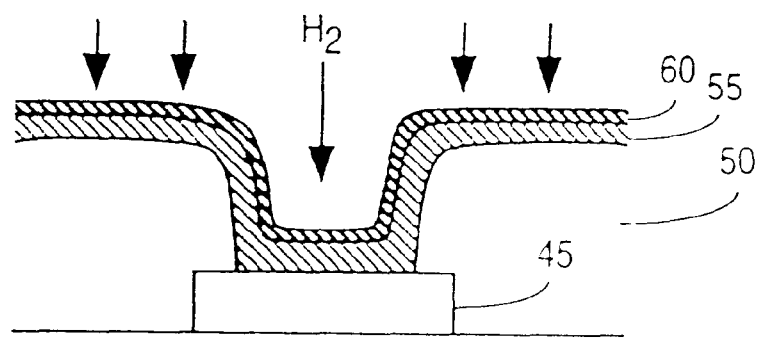
FIG. 1C shows a cross-sectional side view of the device shown in FIG. 1B undergoing rapid thermal processing in ambient hydrogen.

FIGS. 1A through 1C show one embodiment of forming a refractory hydride layer according to the invention. FIG. 1A shows substrate 40 with pad 45 and passivation layer 50. In this embodiment, pad 45 comprises aluminum (Al) but other materials such as copper may be used. Pad 45 is patterned over substrate 40 (e.g., semiconductor substrate) according to a variety of methods that are known in the art. Passivation layer 50 is, for example, silicon dioxide ($SiO_2$), or polyimide, but other like materials may be used. FIG. 1B shows UBM 55 conformally deposited over pad 45 and passivation layer 50. UBM 55 deposition may occur through a variety of methods such as physical vapor deposition (e.g. sputtering or evaporation), chemical vapor deposition, or other like methods. In this example, UBM 55 is comprised of a metal or metal alloy containing at least one refractory metal. Additionally, UBM may comprise a single refractory metal or metal alloy layer or multiple layers.

After deposition of UBM 55, substrate 40 undergoes thermal processing in a rapid thermal processor using ambient hydrogen. FIG. 1C shows substrate 40 undergoing annealing in ambient hydrogen. Annealing may be performed in devices that are capable of rapid and uniform heating such as a rapid thermal processor. In rapid thermal processing, the temperature may range from approximately 300° C. to approximately 500° C. One suitable temperature range for the hydrogen annealing is 350° C. to 450° C. Annealing in hydrogen forms refractory hydride layer 60 of a portion of the material of UBM 55. Refractory hydride layer 60 may range in thickness from approximately 100 Å to approximately 500 Å. After annealing, a bump, such as a Sn—Pb solder bump, may be formed over refractory hydride layer 60 to pad 45 according to processes known in the art.

The invention contemplates various configurations for the UBM layer. For example, in one embodiment, a binary layer (A—B) is comprised of alloys wherein A is a nonrefractory metal such as gold or nickel and B is a refractory metal such as those mentioned herein ranging from 1 to 10 weight percent (wt %). In another embodiment, a bilayer structure A/B is formed where A (non-refractory metal) is on the pad side and B (refractory metal) is on the bump side. In yet another embodiment, a bilayer structure B/A is formed where B is on the pad side. In another embodiment, a three element structure A—B/C is formed that contains two different kinds of refractory metals B and C such as niobium (Nb), titanium (Ti), tantalum (Ta), vanadium (V), or zirconium (Zr). A UBM structure containing a refractory metal layer according to this embodiment has a thickness approximately in the range of 1000 Å to approximately 5000 Å. A is a nonrefractory metal with a thickness approximately in the range of 500 Å to 2000 Å. In each of the above examples, a refractory hydride structure may be formed by annealing the binary layer, bilayer, or multi-layer, respectively, in ambient $H_2$.

Figure 2:
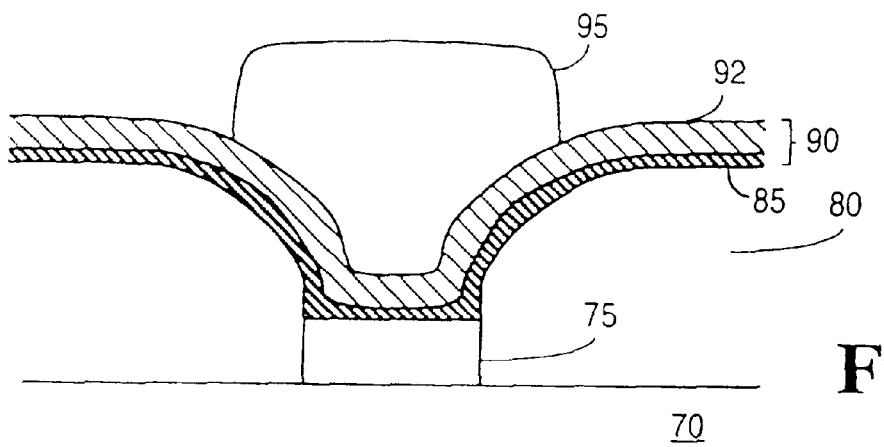
FIG. 2 shows another embodiment of the invention wherein a refractory hydride layer is formed next to the bump.

FIG. 2 shows an embodiment of the invention wherein a cross-section of substrate 70 having pad 75, passivation layer 80, UBM 90 comprising a bilayer of a non-refractory metal layer 92 such as nickel (Ni) or copper (Cu) formed over refractory metal layer 85. The thickness of layer 92 is in the range of 500 Å–1000 Å. According to the invention, this structure is subjected to thermal processing in a rapid thermal processor with ambient hydrogen ($H_2$). A suitable temperature range for the thermal processing is approximately 350° C. to approximately 550° C. Additionally, a suitable time period of this process ranges from approximately one minute to five minutes. After rapid thermal processing, a portion of refractory metal layer 85 is converted to a refractory hydride layer. Refractory hydride layer 85 is essentially formed in a self-aligning process without changing or adding any new materials. Refractory hydride layer 85 has a thickness that preferably ranges from approximately 100 Å to 550 Å and is uniformly controlled by the UBM thickness and the rapid thermal process. Bump 95 is formed over UBM 90.

Figure 3:
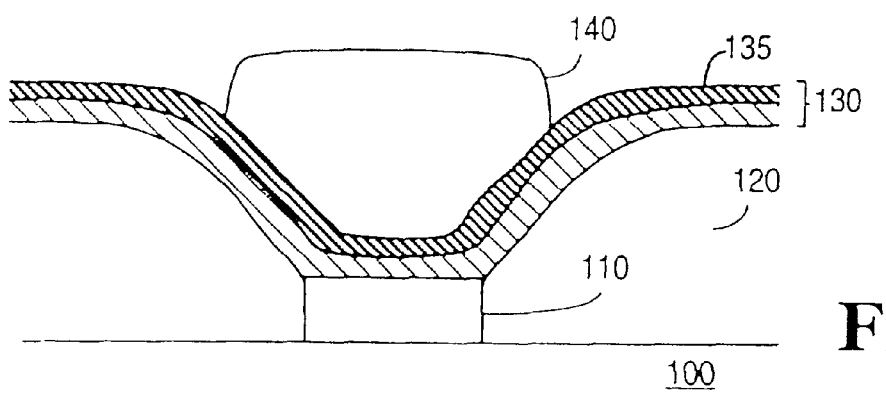
FIG. 3 shows another embodiment of the invention wherein a refractory layer is formed between the bump and the pad.

FIG. 3 shows substrate 100 with pad 110 and passivation layer 120. In this embodiment, UBM layer 130 comprises a refractory metal in a binary alloy ($A_{1-x}B_x$) form. A is a non-refractory metal. B is a refractory metal. In this embodiment, X is in a range of 0.05 to 0.5. Upon thermal processing in $H_2$ ambient (temperature ranging from 350° C. to 550° C.) refractory hydride portion 135 is formed. Bump 140 is formed over UBM layer 130.

Figure 4A:
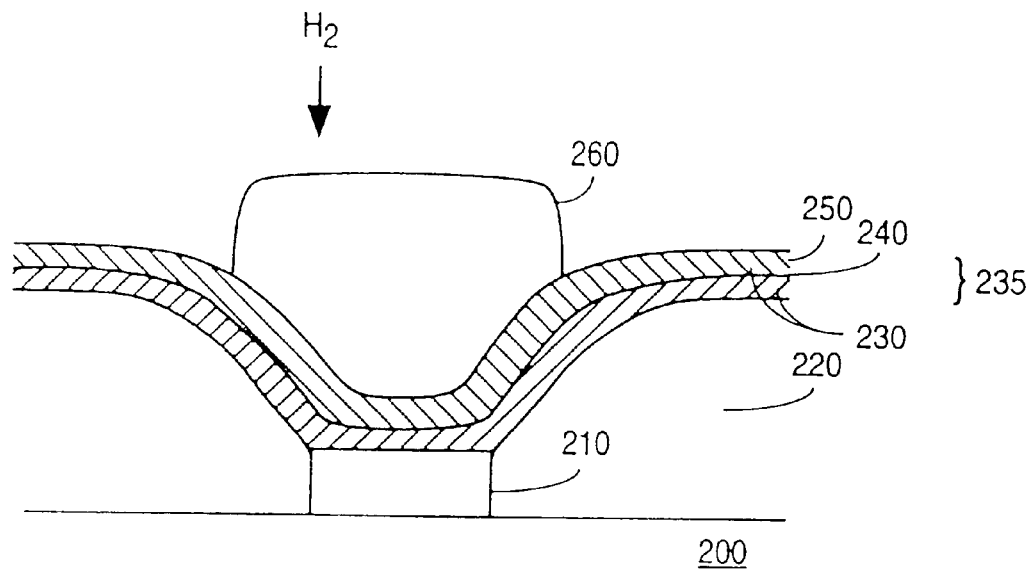
FIG. 4a shows another embodiment of the invention wherein multiple layers of refractory and non-refractory material are formed between the pad and the bump.
Figure 4B:
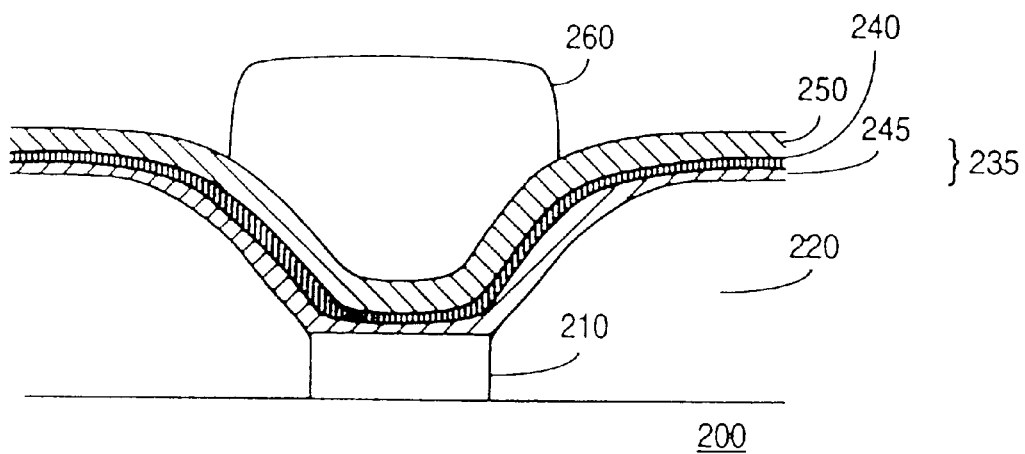
FIG. 4b shows the structure of FIG. 4a after thermal processing to form a refractory hydride layer.

FIG. 4a shows another embodiment of the method of the invention wherein the substrate 200 includes UBM layer 235 of non-refractory metal layer 250 and metal layer 230 that is a binary alloy of a non-refractory metal and a refractory metal. The structure is subjected to thermal processing in ambient $H_2$ to form a refractory hydride. FIG. 4b shows the structure of FIG. 4a after thermal processing comprising non-refractory metal layer 250, refractory hydride layer 240, and non-refractory metal layer 245. In this embodiment, a tri-layer structure is formed with a portion of the binary alloy forming the refractory hydride layer. This structure may be thought of as a combination of two previous structures mentioned in FIG. 2 and FIG. 3.

Figure 5:
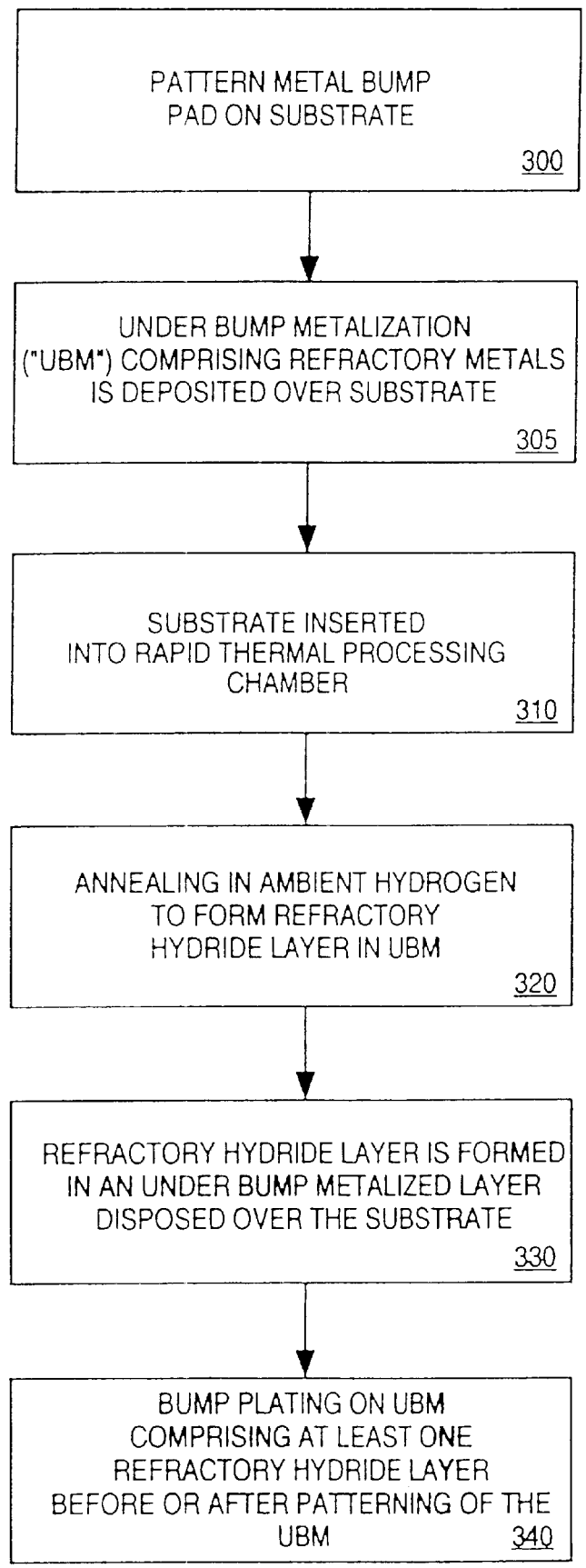
FIG. 5 is a flow chart that illustrates a process for forming a refractory hydride layer using a rapid thermal processing chamber.

FIG. 5 is a flow chart of an embodiment of a method of the invention. At operation 305, a metal pad is patterned on a substrate using methods known in the art. At operation 300, refractory metals are deposited over the pad and a passivation layer previously patterned on the substrate. A variety of methods may be used to deposit the layer of refractory metals on the pad and passivation layer. For example, physical vapor deposition (e.g. sputtering) or electron beam co-evaporation techniques may be used. At operation 310, the substrate of operation 300 is inserted into the rapid thermal processor. Rapid thermal processing occurs in ambient hydrogen at operation 320. In this process, an optimal temperature range of approximately 350° C. through 550° C. and an annealing time in the range of approximately 1–5 minutes is used. At operation 330, a refractory hydride layer is formed. However, it should be noted that multiple refractory hydride layers may be formed using the same operating conditions provided above for forming a single refractory hydride layer. At operation 340, bump plating of the UBM may occur either before or after patterning of the UBM.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

We claim:

1. A method comprising:
   forming a passivation layer over a substrate;
   forming a pad over the substrate which is exposed through the passivation layer;
   forming a layer comprising a refractory material over the pad coupled to the substrate; and
   forming a refractory hydride layer.

2. The method of claim 1, wherein the refractory hydride layer is formed by annealing the substrate in ambient hydrogen.

3. The method of claim 2, wherein the annealing temperature is between the range of approximately 350° C. and approximately 550° C.

4. The method of claim 1, wherein the layer comprising a refractory material over the pad comprises a material selected from the group consisting of hafnium (Hf), niobium (Nb), titanium (Ti), vanadium (V), zirconium (Zr), and any combination thereof.

5. The method of claim 1, wherein the refractory hydride layer comprises a material selected from the group consisting of hafnium (Hf), niobium (Nb), titanium (Ti), vanadium (V), zirconium (Zr), and any combination thereof.

6. The method of claim 1, further comprising forming a bump over the refractory hydride layer.

7. The method of claim 1, wherein the refractory hydride layer has a thickness approximately in the range of 100 Å to 500 Å.

8. The method of claim 2, wherein annealing time is approximately in the range of 1 to 5 minutes.

9. The method of claim 1, wherein the refractory hydride layer adheres to the pad.

* * * * *